Jan. 28, 1958 D. A. CHRISTIAN 2,821,669

MOUNTING ELECTRICAL CIRCUIT COMPONENTS

Filed June 26, 1956 2 Sheets-Sheet 1

Jan. 28, 1958 D. A. CHRISTIAN 2,821,669

MOUNTING ELECTRICAL CIRCUIT COMPONENTS

Filed June 26, 1956 2 Sheets-Sheet 2

2,821,669

Patented Jan. 28, 1958

2,821,669

MOUNTING ELECTRICAL CIRCUIT COMPONENTS

David Adam Christian, Charlton, London, England, assignor, by mesne assignments, to Siemens Edison Swan Limited, a British company Application June 26, 1956, Serial No. 594,025

Claims priority, application Great Britain July 8, 1955

7 Claims. (Cl. 317—101)

Figures 1, 2, 3:
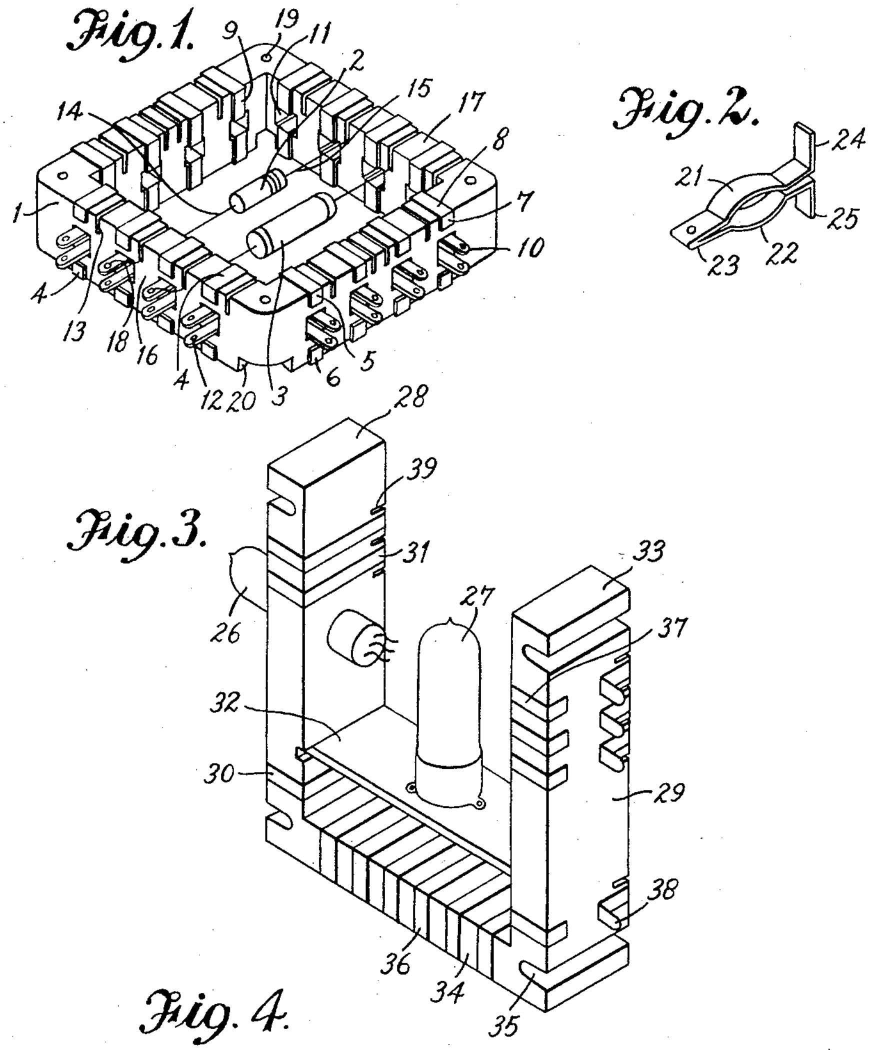

This invention relates to the mounting and electrical interconnection of electrical circuit components and more especially to arrangements of a kind providing for the mounting and electrical interconnection of small components (such as for example the small components used in light current electronic apparatus) to form a circuit assembly comprising a plurality of circuit components electrically interconnected in a required manner.

The development that has taken place in recent years in electronic control and switching systems has given rise to light current circuit arrangements of a very complicated nature involving the use of a large number of small components, and certain problems arise in regard to the provision of suitable mounting and electrical interconnecting arrangements for the components of such circuit arrangements. These problems are to arrange for economy in mounting space, to arrange for ease of access for testing and replacement of components, and to provide for cheap and ready methods of manufacture and assembly suited to mass production. The present invention has in view an improved manner of mounting and assembling and electrically interconnecting electrical circuit components which solves these problems to a large extent.

The present invention provides mounting and electrical interconnecting arrangements which are especially applicable to the mounting and electrical interconnection of small components of the kind having short projecting wires which form integral parts of the component and serve as its terminals. In the case of certain contemplated embodiments of the invention, however, the components involved include, in addition to small components of this kind, somewhat larger components (such as for example thermionic valves and cold cathode tubes) having terminal members not constituted by projecting wires of the nature just mentioned.

According to the main feature of the present invention, a circuit assembly, incorporating circuit components of a circuit arrangement and mounting and electrical interconnecting arrangements for these components, includes a plurality of units each comprising in combination a number of circuit components, a frame of insulating material within which circuit components of the unit are supported, and terminal parts which are carried by the frame and to which wires constituting terminal wires of circuit components of the unit are secured and electrically connected, said units being assembled together serially, with adjoining units face to face, to bring terminal parts occupying corresponding positions in adjoining units into contact to establish requisite electrical connections between units.

In carrying out the invention, it is preferred to arrange that the assembling together of the units of a circuit assembly is effected by clamping the units firmly together by suitable clamping means. Such means may comprise clamping bolts which pass through holes or grooves in the frames of the units. By hot tinning of the terminal parts, good contact between such parts which are brought into contact by clamping may be had.

To derive the advantages of the invention, it is of course necessary for the frame of a unit to be of a form which permits the relevant circuit components to be readily placed and secured in position in the frame.

The positions of the circuit components in the frame of a unit may be predetermined so that in the mass production of identical units the operation of placing and securing the components in position may be carried out in accordance with simple instructions and without the need to refer to a wiring diagram, or might even be performed by automatic mechanical means.

Continuing to refer to the carrying out of the invention, a convenient manner of arranging that a circuit component supported in the frame of one unit may (as is requisite for the particular circuit assembly concerned) be electrically connected through to the adjoining unit on one side, or to the adjoining unit on the other side, or to both adjoining units, is to provide, or at least make provision for the fitting of, two electrically separate terminal parts at each of a plurality of component terminal positions on the frame. Assuming for the moment, for case of description, that the units concerned are fully equipped with such pairs of terminal parts, the preferred arrangement of this kind is one in which one of the pair of electrically separate terminal parts at a component terminal position on the frame is arranged to protrude slightly from one face of the frame and the other is arranged to protrude slightly from the other face of the frame, so that on the serial assembly of the units concerned one of this pair of terminal parts is brought into contact with a terminal part occupying the corresponding terminal position in the adjoining unit on one side and the other of this pair of terminal parts is brought into contact with a terminal part occupying the corresponding terminal position in the adjoining unit on the other side. The electrical connection of a terminal wire of a circuit component supported in the frame through to one or the other or both of the adjoining units can therefore readily be arranged for by securing the wire to one or the other or both of a relevant pair of terminal parts.

Those terminal wires (of the circuit components supported in the frame of a unit) which do not have to be electrically connected through to an adjoining unit may be secured to terminal parts of a form which is not adapted to make contact with terminal parts in adjoining units, and which is conveniently such that a single one of these parts occupies a component terminal position and may be fitted in place of a pair of electrically separate terminal parts (such as have previously been referred to) in any such position.

Clearly, in practice the frame of a unit need not necessarily be equipped with its full component of terminal parts, i. e. a frame may be designed for general use, and those terminal parts of its full complement which are redundant in any specific use of the frame may be omitted when the frame is applied to this specific use. Such omission may be advantageous in facilitating wiring as well as in saving terminal parts.

With regard to the securing of the terminal wires of the circuit components to the terminal parts, it is preferred to provide each terminal part with a tab to which one or more such wires can be secured and electrically connected. It is further preferred to arrange that these tabs project externally from the frames, enabling terminal wires secured to them to be soldered to them by a mass soldering technique such as dip soldering.

In the case of the specific embodiments of the invention which have so far been designed, the frames are of a shape which is broadly rectangular, but frames of other shapes might well prove equally suitable.

It may be arranged that one face of a frame has in it narrow grooves to accommodate terminal wires of circuit components supported in the frame, the grooves being deep enough to facilitate arranging that components supported through the medium of such wires do not protrude beyond either face of the frame. A circuit component of the kind having two terminal wires forming integral parts of it, and projecting from opposite ends of it, may be very readily located in a frame having such grooves by the simple procedure of locating the terminal wires one in one and one in the other of two grooves correspondingly situated in opposite limbs of the frame. In equipping such a frame with circuit components, the terminal wires passing through the grooves are secured to terminal parts located adjacent to the respective grooves.

The terminal parts of a unit may conveniently be located in position on the frame of the unit by grooves in the frame. For example, a terminal part may be formed as a clip which when in position on the frame of a unit has a portion located in a shallow groove in one face of the frame, the groove being of such a depth that the said portion of the clip stands slightly proud of the face of the frame and serves as a contact-making portion (the term "clip" is intended to be interpreted broadly enough to include within its scope a clip-like member the fabrication of which is completed, e. g. by bending over an end portion, in situ on a frame). Where two electrically separate terminal parts are provided at a component terminal position on the frame of a unit, as has previously been referred to, each of these terminal parts may be a clip as just mentioned, one having a contact-making portion located in a shallow groove in one face of the frame and the other having a contact-making portion located in a shallow groove in the other face of the frame. Such a clip may have a tab portion which is remote from the said contact-making portion and which (when the clip is clipped on to a frame) protrudes through an aperture provided in the side of the frame. Where a frame provides for the fitting of only one terminal part at each component terminal position on the frame, a terminal part may be formed as a clip which when in position on the frame embraces a limb of the frame to the extent of extending over both faces, the inner side, and part of the outer side of this limb, at least those portions of the clip which extend over the two faces of the limb, and which constitute contact-making portions, being located in grooves in the limb.

The units of a circuit assembly may be of different thicknesses according to the size and nature of the components to be supported within them.

In the majority of cases it is preferable for a frame to have the form of a complete frame (i. e. one constituting a closed figure), but nevertheless in some cases a frame may be employed which has the form of an incomplete frame in that it does not constitute a closed figure (e. g. a frame may be employed having broadly the form of three sides of a rectangle).

Components such as thermionic valves and cold cathode tubes may be supported by a shelf or shelves within a frame or in apertures in a frame.

A circuit assembly may have at one or at each end a terminal unit which is clamped with the component-containing units of the assembly and which carries terminal members for connecting the circuit arrangement constituted by the circuit assembly to external circuits (such as for example input and output and power supply circuits). The terminal members of such a terminal unit are arranged to make contact with respective terminal parts of the adjoining component-containing unit. A terminal unit may comprise a flat plate of insulating material, the terminal members having tabs (for connection to external circuits) which project from the outer face of this plate. Alternatively, a terminal unit may comprise a frame generally similar to the frame of a component-containing unit. Instead of having tags, the terminal members may be formed with pins or sockets for connection to external circuits via a socket-ended or plug-ended cable.

Units providing special facilities (e. g. test point sockets or the like) may be included in a circuit assembly.

A unit may comprise printed circuits connected to terminal parts.

Partitions or screens may be clamped between units of a circuit assembly, the partitions or screens being formed so as not to interfere with the requisite electrical connections, made by way of the terminal parts of the units, between circuit components in different units.

By way of example, forms of component-containing unit, terminal unit, and circuit assembly according to the invention will now be described with reference to the accompanying drawings. Fig. 1 of the drawings shows one form of component-containing unit, and Fig. 2 shows a form of terminal part which may be fitted in place of any of the sixteen pairs of terminal parts which are illustrated in Fig. 1. Fig. 3 is a view illustrating the nature of the frame and terminal parts of another form of component-containing unit. Figs. 4, 5, 6, 7, and 8 all relate to a specific circuit assembly according to the invention, Fig. 4 being a circuit diagram of the circuit arrangement constituted by the circuit assembly, Fig. 5 being a plan view of the upper one of the two component-containing units of the assembly, Fig. 6 being a plan view of the lower one of these two units, Fig. 7 being a plan representation of a terminal unit, and Fig. 8 being a view showing the units of the assembly in the relative positions which they occupy when clamped together (by clamping nuts and bolts omitted in the figure) to form the specific circuit assembly.

Referring firstly to Fig. 1, the form of component-containing unit shown in this figure has a frame 1 of insulating material and of a shape which is broadly rectangular. For the sake of simplicity only two circuit components, 2 and 3, are shown supported within the frame of the unit, but it will be clear from the figure and from what follows that more than two circuit components such as 2 and 3 can be accommodated in such a frame. Each of the components 2 and 3 is of the kind having two terminal wires forming integral parts of it and projecting from opposite ends of it. The frame 1 is shown equipped with a full complement of terminal parts, the particular full complement shown consisting of thirty-two similar terminal parts 4 arranged in pairs, there being a pair of electrically separate terminal parts at each of sixteen component terminal positions on the frame. Each of these pairs of terminal parts comprises an upper (as shown) terminal part 5 and a lower (as shown) terminal part 6. Each terminal part 4 is formed as a clip having an end portion 7, a contact-making portion 8, a base portion 9, and a tab portion 10. The contact-making portion 8 of the upper terminal part of a pair is located in a shallow groove in the upper (as shown) face of the frame 1, and the contact-making portion of the lower terminal part of the pair is located in a corresponding groove in the other face of the frame 1. The grooves just mentioned are of such a depth that the contact-making portion 8 of a terminal part 4 stands slightly proud of the relevant face of the frame. The tab portions 10 of the two terminal parts 4 of a pair protrude through an aperture 11 which extends from the inside to the outside of the frame 1, there being four such apertures in each limb of the frame. Near the extremity of the tab portion 10 of each terminal part 4 is a hole 12 through which a component terminal wire can be threaded when such a wire has to be secured to the tab portion. A hole 12 may be large enough to accommodate two or more terminal wires. The upper face of the frame 1 has in it sixteen grooves 13, one for each component terminal position. These grooves 13, which are much narrower and deeper than the grooves accommodating the contact-making portions 8 of the terminal parts 4, serve to accommodate terminal wires of circuit components supported in the frame. In the particular case illustrated, the component 2 is located and supported within the frame 1 by reason of the facts that the terminal wire 14 of the component is located in one of the grooves 13 in the limb 16 of the frame and is secured (as shown at 18) to the tab portion of a terminal part 4 pertaining to the same component terminal position as this groove, and that the terminal wire 15 of the component is located in one of the grooves 13 in the limb 17 of the frame and is secured to the tab portion of a terminal part 4 pertaining to the same component terminal position as this last-mentioned groove. The terminal wires 14 and 15 are soldered to the respective relevant terminal parts to provide good low-resistance connections between the wires and these terminal parts. It will be noted that the two grooves 13 in which the terminal wires 14 and 15 are respectively located are correspondingly situated in the opposite limbs 16 and 17 of the frame; this is a preferred manner of locating a circuit component in the frame. The component 3 is located and supported within the frame 1 in a similar manner to the component 2. It will of course be understood that, although not so shown in the figure, the ends of the component terminal wires may be wrapped round the tab portions of the relevant terminal parts. In each corner of the frame 1 is a hole 19 for accommodating a clamping rod or bolt. One corner of the frame is distinguished from the other three corners, to assist in the correct assembly of the different units making up a circuit assembly, by having in it a keyway 20.

Referring now to Fig. 2, the form of terminal part shown in this figure is one which may be fitted in place of any of the sixteen pairs of terminal parts illustrated in Fig. 1. This form of terminal part is not adapted to make contact with terminal parts in adjoining units, and therefore may be used with advantage (as will appear more clearly later when the circuit assembly to which Figs. 4 to 8 pertain is described) in cases where a component terminal wire does not have to be electrically connected through to an adjoining unit. When the terminal part of Fig. 2 is fitted in place of one of the pairs of terminal parts illustrated in Fig. 1, the portions 21 and 22 of the terminal part engage, and are forced towards each other and gripped tightly by, the upper and lower surfaces of the relevant aperture 11, and the portion 23, which is a tab portion, protrudes through this aperture. The portions 24 and 25 lie against the inner side of the relevant limb of the frame.

Referring now to Fig. 3, the form of component-containing unit to which this figure pertains is one which provides for the mounting of thermionic valves and cold cathode tubes. The unit concerned is not intended to be used in a circuit assembly in which units of the exact form illustrated in Fig. 1 are employed. The figure illustrates the forms taken by the frame and terminal parts of the unit, but does not show the wiring or any circuit components other than two thermionic valves or cold cathode tubes 26 and 27. The thermionic valve or cold cathode tube 26 is accommodated in an aperture extending from the inside to the outside of the limb 28 of the frame 29 of the unit, this aperture being situated between shallow grooves in the limb 28 which serve to locate terminal parts 30 and 31. The manner in which the tube 26 is accommodated is especially suitable for a cold cathode tube, since it facilitates that exposure of the tube to light which is necessary for reliable operation of a cold cathode tube. The thermionic valve or cold cathode tube 27 is mounted on a shelf 32 located in grooves in the inside edges of the two opposite limbs 28 and 33 of the frame 29. The shelf and the frame are both of insulating material. As is apparent from the figure, the frame is formed as three sides of a rectangle, the frame having no limb opposite to the limb 34 which joins the two vertical (as shown) limbs 28 and 33. The reason for using this incomplete (in as much as it does not constitute a closed figure) form of frame is to provide for the ventilation of, and/or for the access of light to, the tube mounted on the shelf 32. In a contemplated modification, the frame has a limb opposite to the limb 34, and this further limb is provided with a large aperture or apertures to provide for ventilation and/or access of light. Continuing to refer to Fig. 3, the frame 29 has in it four deep grooves 35, one near each corner, for accommodating clamping rods or bolts. The frame is shown equipped with a full complement of terminal parts 36, two particular ones of which, 30 and 31, have already been referred to. Only one terminal part is provided at each component terminal position on the frame, and each terminal part is formed as a clip which embraces the relevant limb of the frame to the extent of extending over both faces, the inner side, and part of the outer side of this limb. Each terminal part has two contact-making portions, these being the portions, such as 37, which extend over the two faces of the relevant limb of the frame. Since the figure only shows one face of the frame 29, only one contact-making portion of each terminal part 36 can be seen in the figure. The contact-making portions of a terminal part are located in grooves in the relevant limb, but are arranged to stand slightly proud of the relevant face of the frame. Each terminal part 36 has a tab portion 38. One face of the frame 29 has in it a number of grooves 39 which correspond to the grooves 13 in the frame shown in Fig. 1 and are provided to serve to accommodate terminal wires of circuit components supported in the frame.

Figure 4:
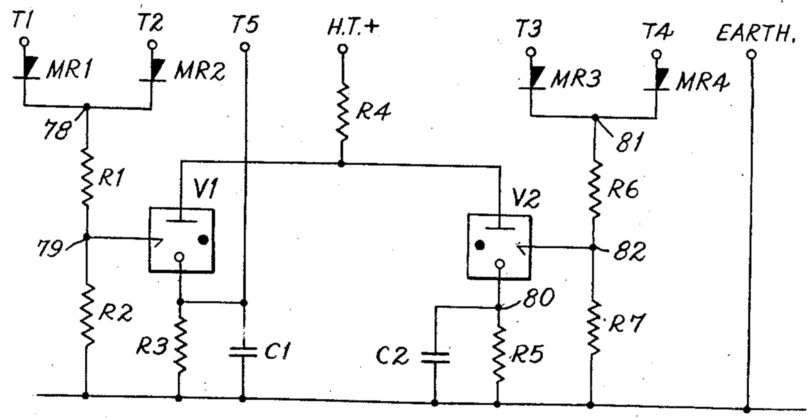
Figures 5, 6:
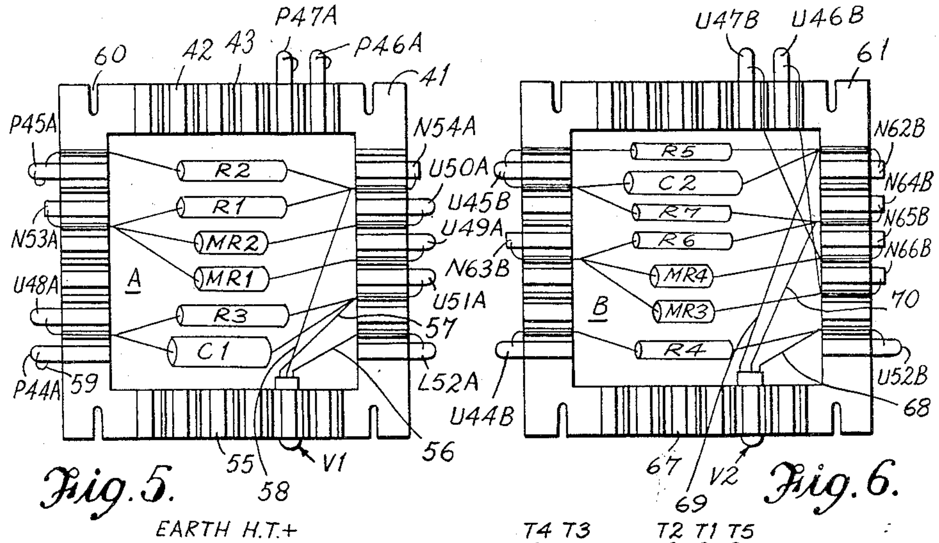
Figure 7:
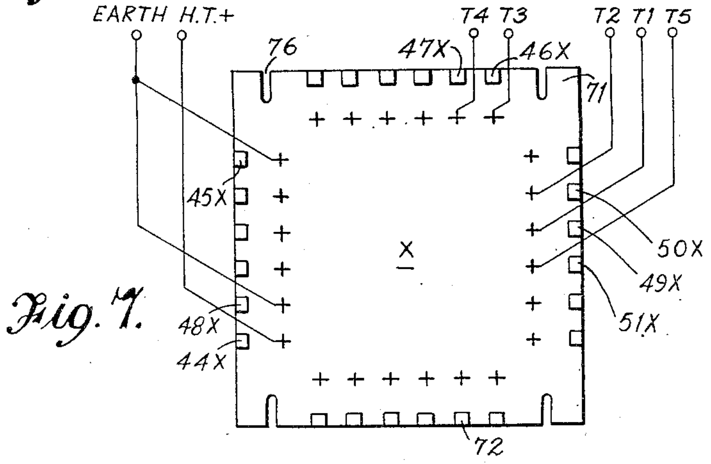

Referring now to Figs. 4, 5, 6, 7, and 8, the specific circuit assembly to which all these figures relate is one (see Fig. 8) comprising two component-containing units A and B, a terminal unit X, and an end plate 40. The circuit assemby is arranged to constitute the circuit arrangement of which Fig. 4 is a circuit diagram, it being however assumed herein that the particular terminals designated T1, T2, T3, T4, T5, H. T.+, and "Earth" in this diagram are external terminals to which terminal parts of a terminal unit of the assembly are connected by connecting leads. The circuit components of this circuit arrangement comprise two cold cathode tubes V1 and V2 (each of the type having an anode, a cathode, and a trigger electrode), four metal rectifiers MR1, MR2, MR3, and MR4, two capacitors C1 and C2, and seven resistors R1, R2, R3, R4, R5, R6, and R7. The function and manner of operation of the circuit arrangement do not concern the present invention, and will only be referred to very briefly. The circuit arrangement constitutes a bistable trigger circuit. In one stable condition, the "off" condition, the tube V2 is discharging and the tube V1 is extinguished. In response to the appearance, whilst the trigger circuit is in the "off" condition, of a positive-going switching pulse at either of the controlling input terminals T1 and T2, the tube V1 strikes and thereby brings about, by reason of the presence of the common anode circuit resistor R4, the extinguishing of the tube V2. The trigger circuit is thus brought to its other stable condition, the "on" condition, in which the tube V1 is discharging and the tube V2 is extinguished. As long as the trigger circuit is in its "on" condition, the output terminal T5 has a potential which is positive with respect to earth, with the result that apparatus in another circuit arrangement is brought to a requisite condition. Upon the subsequent appearance of a positive-going switching pulse at either of the controlling input terminals T3 and T4, the tube V2 strikes and thereby brings about the extinguishing of the tube V1, and the trigger circuit is restored to its "off" condition.

The unit A comprises (see the plan view of this unit shown in Fig. 5) a frame 41 of insulating material which has in it shallow grooves 42 for locating terminal parts, and grooves 43 for accommodating terminal wires of circuit components supported in the frame. The frame is designed to carry a larger number of terminal parts than the fifteen terminal parts with which it is equipped. These fifteen terminal parts comprise eight terminal parts similar to the terminal parts 4 in Fig. 1 and arranged to form four pairs P44A, P45A, P46A, and P47A, five terminal parts U48A, U49A, U50A, U51A, and L52A similar to the terminal parts 4 in Fig. 1 but not having terminal parts paired with them in the unit A, and two terminal parts N53A and N54A similar to the terminal part shown in Fig. 2. In designating the terminal parts of the units A, B, and X, terminal parts which occupy corresponding component terminal positions in different units, and become commoned together electrically on the clamping together of the units of the assembly, are given the same numerical designation. The alphabetical suffix "A," "B," or "X" denotes the unit to which a terminal part belongs. The alphabetical prefix "P" denotes a pair of terminal parts similar to the terminal parts 4 in Fig. 1. The alphabetical prefix "U" denotes a terminal part which is similar to the terminal parts 4 in Fig. 1 and which is clipped on to the unit concerned so that its contact-making portion is located on the upper (as seen in the figures) face of this unit, and the alphabetical prefix "L" denotes a terminal part which is similar to the terminal parts 4 in Fig. 1 and which is clipped on to the unit concerned so that its contact-making portion is located on the lower face of this unit. The alphabetical prefix "N" denotes a terminal part which is similar to the terminal part shown in Fig. 2 and which is consequently not adapted to make contact with terminal parts in units adjoining the unit to which it belongs. As will be clear from Fig. 5, the circuit components MR1, MR2, C1, R1, R2, and R3 are all of the kind having two terminal wires projecting from opposite ends, and are supported within the frame 41 of unit A by means of these wires, which are secured to appropriate terminal parts of the unit. The cold cathode tube V1 is accommodated in an aperture extending from the inside to the outside of the limb 55 of the frame 41, the anode of the tube being connected (by a terminal wire 56) to the terminal part L52A, the cathode being connected (by a terminal wire 57) to the terminal part U51A, and the trigger electrode being connected (by a terminal wire 58) to the terminal part N54A. In the case of each of the four pairs of terminal parts P44A, P45A, P46A, and P47A, the two terminal parts of a pair are commoned together electrically by short wire strappings (as indicated at 59) between the tabs of the pair. The frame 41 has in it four deep grooves 60 for accommodating the clamping rods or bolts (not shown in the figures) by which the units A, B, and X, and the end plate 40, are clamped together.

The unit B comprises (see the plan view of this unit shown in Fig. 6) a frame 61 which is similar to the frame 41 of unit A. It is equipped with ten terminal parts U44B, U45B, U46B, U47B, U52B, N62B, N63B, N64B, N65B, and N66B. As will be clear from Fig. 6, the circuit components MR3, MR4, C2, R4, R5, R6, and R7 are all of the kind having two terminal wires projecting from opposite ends, and are supported within the frame 61 by means of these wires, which are secured to appropriate terminal parts of the unit. The cold cathode tube V2 is accommodated in an aperture extending from the inside to the outside of the limb 67 of the frame 61, the anode of the tube being connected (by a terminal wire 68) to the terminal part U52B, the cathode being connected (by a terminal wire 69) to the terminal part N62B, and the trigger electrode being connected (by a terminal wire 70) to the terminal part N64B.

The terminal unit X comprises (see the plan view of this unit shown in Fig. 7 and the view of this unit shown in Fig. 8) a flat plate 71 of insulating material which has in its under (with regard to the views shown) surface shallow grooves for accommodating terminal parts. The plate 71 is shown equipped with its full complement of twenty-four terminal parts. Each of these terminal parts has an end portion 72, a contact-making portion 73 (shown in dotted lines in Fig. 8 in the case of one terminal), and a tab portion 74 (see Fig. 8). Each tab portion has a twist 75 in it for the purpose of securing the terminal firmly in position in the plate 71. The tab portions are represented by small crosses in the somewhat schematic plan view of Fig. 7. The plate 71 has in it four deep grooves 76 for accommodating the clamping rods or bolts by which the units A, B, and X, and the end plate 40, are clamped together. As will be clear from Fig. 7, only eight of the terminal parts of the unit X are actually used in the specific circuit assembly now being described. Of these eight terminal parts, the two terminal parts 45X and 48X are connected externally to the earth terminal designated "Earth" in Fig. 4, and the terminal part 44X is connected externally to the high tension positive terminal designated H. T.+ in Fig. 4. The terminal parts 49X, 50X, 46X, 47X, and 51X are respectively connected externally to the terminals T1, T2, T3, T4, and T5 of Fig. 4.

The end plate 40 of the circuit assembly is a plate of insulating material which has in it four deep grooves 77 for accommodating the clamping rods or bolts previously referred to.

Figure 8:
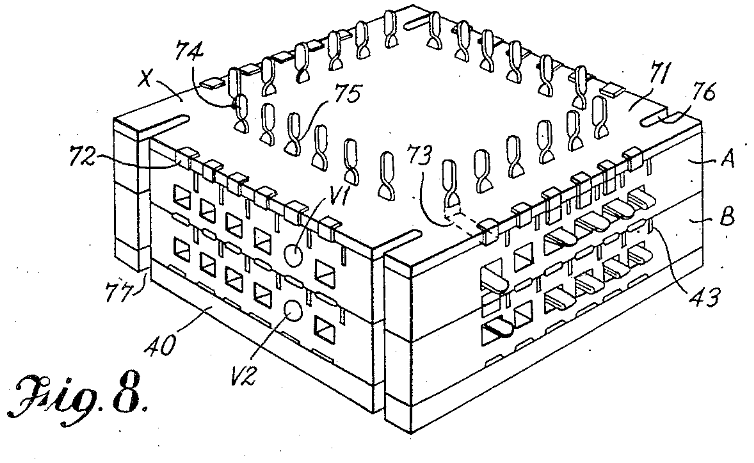

When the two component-containing units A and B, the terminal unit X, and the end plate 40 are clamped together to constitute the specific circuit assembly, the units and end plate then occupying the relative positions in which they are shown in Fig. 8, the electrical interconnections which are effected by contacts between terminal parts of different units are as follows. The contacts between the terminal part U44B and the lower terminal part of the linked pair P44A, and between the upper terminal part of this pair and the terminal part 44X, serve to connect one terminal wire of the component R4 to the terminal part 44X (for connection to high tension positive). The contact between the terminal parts U48A and 48X serves to connect one terminal wire of each of the two components C1 and R3 to the terminal part 48X (for connection to earth). The contacts between the terminal part U45B and the lower terminal part of the linked pair P45A, and between the upper terminal part of this pair and the terminal part 45X, serve to connect one terminal wire of each of the four components C2, R2, R5, and R7 to the terminal part 45X (for connection to earth). The contacts between the terminal part U47B and the lower terminal part of the linked pair P47A, and between the upper terminal part of this pair and the terminal part 47X, serve to connect one terminal wire of the component MR4 to the terminal part 47X (for connection to the terminal T4). The contacts between the terminal part U46B and the lower terminal part of the linked pair P46A, and between the upper terminal part of this pair and the terminal part 46X, serve to connect one terminal wire of the component MR3 to the terminal part 46X (for connection to the terminal T3). The contact between the terminal parts U50A and 50X serves to connect one terminal wire of the component MR2 to the terminal part 50X (for connection to the terminal T2). The contact between the terminal parts U49A and 49X serves to connect one terminal wire of the component MR1 to the terminal part 49X (for connection to the terminal T1). The contact between the terminal parts U51A and 51X serves to connect to the last-mentioned terminal part (for connection to the terminal T5) the cathode terminal wire 57 of the component V1 and one terminal wire of each of the two components C1 and R3. The contact between the terminal parts U52B and L52A serves to connect together the anode terminal wire 68 of the component V2, one terminal wire of the component R4, and the anode terminal wire 56 of the component V1. The five terminal parts N53A, N54A, N62B, N63B, and N64B constitute the five commoning points which are respectively designated 78, 79, 80, 81, and 82 in Fig. 4.

What I claim is:

1. A circuit assembly, incorporating circuit components of a circuit arrangement and mounting and electrical interconnecting arrangements for these components, including a plurality of component-containing units each comprising in combination a frame formed of insulating material and framing a space for the accommodation of circuit components and having in each of its two oppositely facing framelike faces locating grooves defining a plurality of component terminal positions on the frame, a locating groove being disposed in each of said two framelike faces at each of these component terminal positions, a plurality of terminal parts carried by said frame at such component terminal positions, each said terminal part being in the form of a clip having a contact-making portion which is located in a said locating groove in a framelike face of said frame, said terminal part standing proud of this face and having a tab portion which protrudes from the side of said frame, a number of circuit components supported in said space, and wires constituting terminal wires of these circuit components of the unit and secured to and electrically connected to said tab portions of said terminal parts, said component-containing units being assembled together serially with adjoining units having a framelike face of the frame of one unit face to face with a framelike face of the frame of the other unit and having said contact-making portions of terminal parts occupying corresponding component terminal positions on the frames of the two units in contact with each other.

2. A circuit assembly according to claim 1 including a said component-containing unit having, at a said component terminal position on its frame, a pair of electrically separate terminal parts, one terminal part of the pair having a contact-making portion located in the relevant said locating groove in one framelike face of the frame of the unit and the other terminal part of the pair having a contact-making portion located in the relevant said locating groove in the other framelike face of this frame.

3. A circuit assembly according to claim 1 including a said component-containing unit in which a said framelike face of the frame of the unit has narrow grooves therein, additional to said locating grooves, for accommodating terminal wires of circuit components of the unit.

4. A circuit assembly according to claim 2 in which said tab portions of said pair of electrically separate terminal parts both protrude from a single aperture in the side of the frame of the unit.

5. A circuit assembly according to claim 1 including a said component-containing unit having, at a said component terminal position on its frame not fitted with a said terminal part, a terminal part having a tab portion without a contact-making portion, said tab portion protruding from an aperture in the side of the frame of the unit and the terminal part having in this aperture portions adapted to be gripped by surfaces of the aperture for the holding of the terminal part in position in the frame of the unit.

6. A circuit assembly according to claim 1 including a said component-containing unit having, at a said component terminal position on its frame, a said terminal part embracing a limb of the frame to the extent of extending over both faces, the inner side, and part of the outer side of this limb.

7. A circuit assembly according to claim 1 including, at an end thereof, a terminal unit assembled serially with said component-containing units and carrying terminal members, adapted to make contact with respective said terminal parts of the adjoining component-containing unit, for connecting the circuit arrangement constituted by the circuit assembly to external circuits.

References Cited in the file of this patent

UNITED STATES PATENTS

| | | |
|---|---|---|
| 2,446,701 | Greene | Aug. 10, 1948 |
| 2,783,416 | Butler | Feb. 26, 1957 |

FOREIGN PATENTS

| | | |
|---|---|---|
| 997,587 | France | Jan. 8, 1952 |
| 1,076,965 | France | Nov. 3, 1954 |